United States Patent
Okamoto et al.

(10) Patent No.: US 9,321,142 B2
(45) Date of Patent: *Apr. 26, 2016

(54) POLYMER MATERIAL, FOAM OBTAINED FROM SAME, AND POLISHING PAD USING THOSE

(75) Inventors: Chihiro Okamoto, Kurashiki (JP); Shinya Kato, Kurashiki (JP); Shunji Kaneda, Kurashiki (JP); Hirofumi Kikuchi, Kurashiki (JP)

(73) Assignee: KURARAY CO., LTD., Kurashiki-shi (JP)

( * ) Notice: Subject to any disclaimer, the term of this patent is extended or adjusted under 35 U.S.C. 154(b) by 1627 days.

This patent is subject to a terminal disclaimer.

(21) Appl. No.: 12/067,297

(22) PCT Filed: Sep. 21, 2006

(86) PCT No.: PCT/JP2006/319215
§ 371 (c)(1),
(2), (4) Date: Mar. 19, 2008

(87) PCT Pub. No.: WO2007/034980
PCT Pub. Date: Mar. 29, 2007

(65) Prior Publication Data
US 2009/0298392 A1    Dec. 3, 2009

(30) Foreign Application Priority Data

Sep. 22, 2005  (JP) ................................. 2005-275768
Mar. 30, 2006  (JP) ................................. 2006-094698

(51) Int. Cl.
| | | |
|---|---|---|
| C09K 3/14 | (2006.01) | |
| B24B 37/24 | (2012.01) | |
| C08G 18/08 | (2006.01) | |
| C08G 18/32 | (2006.01) | |
| C08G 18/42 | (2006.01) | |
| C08G 18/48 | (2006.01) | |
| C08G 18/66 | (2006.01) | |
| C08J 9/12 | (2006.01) | |
| H01L 21/3105 | (2006.01) | |
| C08G 101/00 | (2006.01) | |

(52) U.S. Cl.
CPC ............ *B24B 37/24* (2013.01); *C08G 18/0895* (2013.01); *C08G 18/3212* (2013.01); *C08G 18/4238* (2013.01); *C08G 18/4854* (2013.01); *C08G 18/664* (2013.01); *C08G 18/6674* (2013.01); *C08J 9/122* (2013.01); *H01L 21/31053* (2013.01); *C08G 2101/00* (2013.01); *C08J 2375/04* (2013.01)

(58) Field of Classification Search
None
See application file for complete search history.

(56) References Cited

U.S. PATENT DOCUMENTS

| | | | | |
|---|---|---|---|---|
| 3,256,506 A | * | 6/1966 | Anderson et al. ............. | 521/171 |
| 3,577,358 A | * | 5/1971 | Santelli et al. ................ | 521/151 |
| 3,706,687 A | * | 12/1972 | Rudzki ......................... | 521/118 |
| 3,769,245 A | | 10/1973 | Stewart et al. | |
| 4,306,052 A | | 12/1981 | Bonk et al. | |
| 5,714,523 A | * | 2/1998 | Hopper et al. ............... | 521/49.5 |
| 6,159,581 A | * | 12/2000 | Yoneda et al. ............. | 428/195.1 |
| 2003/0083416 A1 | | 5/2003 | Kaufhold et al. | |
| 2004/0054023 A1 | | 3/2004 | Kaneda et al. | |
| 2004/0224622 A1 | * | 11/2004 | Sakurai et al. ................ | 451/526 |
| 2006/0079589 A1 | * | 4/2006 | Tadokoro et al. ............. | 521/155 |
| 2008/0313967 A1 | * | 12/2008 | Sakurai et al. ................. | 51/298 |
| 2010/0035521 A1 | * | 2/2010 | Kato et al. ...................... | 451/28 |
| 2010/0120343 A1 | * | 5/2010 | Kato et al. .................... | 451/533 |

FOREIGN PATENT DOCUMENTS

| | | |
|---|---|---|
| CN | 1586002 A | 2/2005 |
| JP | 2002 59357 | 2/2002 |
| JP | 2003 249470 | 9/2003 |
| JP | 2004 123975 | 4/2004 |
| JP | 2004 223654 | 8/2004 |
| JP | 2004 358584 | 12/2004 |
| JP | 2005 22041 | 1/2005 |
| JP | 2005 169570 | 6/2005 |
| JP | 2005 236200 | 9/2005 |
| JP | 2005 350574 | 12/2005 |
| WO | 03 043071 | 5/2003 |

OTHER PUBLICATIONS

Extended European Search Report issued Oct. 27, 2010, in European Patent Application No. 06810673.1.

* cited by examiner

*Primary Examiner* — Jun Li
*Assistant Examiner* — Ross J Christie
(74) *Attorney, Agent, or Firm* — Oblon, McClelland, Maier & Neustadt, L.L.P.

(57) ABSTRACT

The subject is to provide a polymer material which enables to improve planarity and planarization efficiency of a polished surface and is useful as a polishing pad which generates only a few scratches. The said subject is solved by a polymer material having a tensile modulus at 50° C. after saturation swelling with 50° C. water of 130 to 800 MPa, a loss tangent at 50° C. of not more than 0.2, and a contact angle with water of not more than 80°.

20 Claims, No Drawings

POLYMER MATERIAL, FOAM OBTAINED FROM SAME, AND POLISHING PAD USING THOSE

TECHNICAL FIELD

The present invention relates to a polymer material, a foam obtained from same, and polishing pads using those. The present invention can be applied, for example, to a polishing pad useful for the highly precise and highly efficient polishing of semiconductor wafers and the like.

BACKGROUND ART

The polishing pads used for the mirror finishing (for example, chemical mechanical polishing or CMP) of the semiconductor wafers used as substrates for the fabrication of integrated circuits frequently take the form of composite materials of a resin and a velour-quality or suede-quality fabric, or of a relatively soft sheet with a large compressive deformability as yielded by impregnating nonwoven fabric with a thermoplastic polyurethane resin and inducing wet coagulation.

Accompanying higher levels of integration and the increasing use of multilayer wirings, there has been increasing demand in recent years with regard to semiconductor wafers for cost reductions in addition to quality improvements such as higher levels of planarization. In association with these trends, the demands on polishing pads have included long-term usability and higher functionality, for example, the ability to achieve better planarization than to date.

The existing polishing pads that are based on a relatively soft nonwoven fabric have good contact properties with the wafer and also exhibit an excellent polishing slurry retention; however, due to their softness they have an inadequate capacity to planarize the surface to be polished. In addition, polishing slurry and polishing debris clog the void regions in the nonwoven fabric, which results in a tendency for damage to the wafer surface to easily occur. Moreover, cleaning is problematic as the polishing slurry and polishing debris infiltrate the void regions in the nonwoven fabric in depth and a short polishing pad life is thus also a problem.

Polishing pads that use a polymer foam are also known; they are often used in applications that require planarization, such as wafer polishing, because they are more rigid than the nonwoven fabric-type polishing pads. In addition, due to their independent cell structure, polishing pads that use a polymer foam are not subject to the in-depth infiltration into void regions by polishing slurry and polishing debris that is seen with nonwoven fabric-type polishing pads, and because of this polishing pads that use a polymer foam are relatively easy to clean and can also tolerate long-term use. Polyurethane foam is frequently used as the polymer foam in particular for its excellent wear resistance.

Polyurethane foam polishing pads are generally produced by appropriately grinding or slicing a polyurethane foam. The polyurethane foam used for polishing pads has heretofore been produced by foaming and curing a two-liquid curable polyurethane by casting (refer, for example, to Japanese Patent Application Laid-open No. 2000-178374, Japanese Patent Application Laid-open No. 2000-248034, Japanese Patent Application Laid-open No. 2001-89548, and Japanese Patent Application Laid-open No. Hei 11-322878). However, it has been difficult with this method to achieve a uniform reaction and foaming, and there have also been limits with this method on the ability to raise the hardness of the obtained polyurethane foam. In addition, the polishing characteristics, such as the planarity of the polished surface and the planarization efficiency, of conventional polyurethane foam polishing pads may fluctuate, and one cause of this is thought to be nonuniformity in the foam structure in the polyurethane foam that forms the base. Moreover, a polishing pad having a higher hardness is desired in order to raise the planarization efficiency (refer to *The Science of CMP*, Masahiro KASHIWAGI et al., Science Forum Inc., published 20 Aug. 1997, pp. 113-119).

With regard to high-hardness polishing pads, on the other hand, a polishing pad has been proposed that comprises a polyurethane foam that has a density of 0.5 to 1.0 g/cm$^3$, a cell size of 5 to 20 µm, and a hardness (JIS-C hardness) of at least 90 (refer to Japanese Patent Application Laid-open No. 2002-371154). This polyurethane foam comprises a thermoplastic polyurethane that is obtained by reacting a polymer diol, an organic diisocyanate, and a chain extender and that contains at least 6 weight % nitrogen atom derived from the isocyanate group and has a dynamic viscoelastic modulus E'$_{50}$ at 50° C. of at least 5×10$^9$ dyn/cm$^2$. However, when this polishing pad according to the cited invention containing at least 6 weight % isocyanate-derived nitrogen atom is used, its excessively high hardness creates the risk that a large number of scratches will be generated in the surface of the polished wafer.

The present invention was pursued in view of the circumstances described above and has as an object the introduction of a polishing pad that can achieve an improved planarity for the polished surface and an improved planarization efficiency while producing little scratching. Additional objects are the introduction of a polymer material and a foam obtained from this polymer material. They are useful as the said polishing pad. The present invention in particular has as an object the introduction of a polishing pad that exhibits a stable polishing rate even in the presence of water.

DISCLOSURE OF THE INVENTION

As a result of extensive investigations directed to achieving the preceding objects, the present inventors discovered that the sought after characteristics are exhibited by a polymer material, for example, of polyurethane, having a specific tensile modulus, loss tangent, and contact angle with water, a foam obtained from this polymer material, and polishing pads that use this polymer material or foam. The present invention was achieved based on this discovery.

Thus, the present invention provides a polymer material that has a tensile modulus at 50° C. after saturation swelling with 50° C. water of 130 to 800 MPa, a loss tangent (value of tan δ) at 50° C. of not more than 0.2, and a contact angle with water of not more than 80° (this is also referred to hereafter simply as the polymer material).

The present invention also encompasses the aforesaid polymer material that has a retention of tensile modulus (a value obtained by dividing the tensile modulus at 50° C. after saturation swelling with 50° C. water by a tensile modulus at 50° C. after being allowed to stand at 20° C./65% RH and multiplying by 100) of at least 55%.

The present invention also encompasses the aforesaid polymer material that has a ratio E'$_{23}$/E'$_{50}$ between a storage modulus at 23° C. (E'$_{23}$) and a storage modulus at 50° C. (E'$_{50}$) of not more than 1.8.

The present invention also encompasses the aforesaid polymer material wherein the polymer material is a polyurethane obtained by reacting a polymer diol, an organic diisocyanate, and a chain extender.

The present invention also encompasses the aforesaid polymer material wherein the polyurethane is a thermoplastic polyurethane and contains at least 4.8 weight % but less than 6.0 weight % nitrogen atom derived from the isocyanate group.

The present invention also encompasses the aforesaid polymer material, wherein the polymer diol contains at least one component with a number-average molecular weight of 1400 to 5000.

The present invention also encompasses the aforesaid polymer material, wherein the polymer diol contains a polyester diol and/or a polyether diol.

The present invention also encompasses the aforesaid polymer material, wherein the polymer diol contains a polyester diol produced using a $C_{6-12}$ diol.

The present invention also encompasses the aforesaid polymer material that is obtained by reacting:

at least one selection from the group consisting of poly(ethylene glycol), poly(tetramethylene glycol), poly(nonamethylene adipate), poly(2-methyl-1,8-octamethylene adipate), poly(2-methyl-1,8-octamethylene-co-nonamethylene adipate), and poly(methylpentane adipate) as the polymer diol;

at least one selection from the group consisting of 4,4'-diphenylmethane diisocyanate, 2,4-tolylene diisocyanate, 2,6-tolylene diisocyanate, and isophorone diisocyanate as the organic diisocyanate; and at least one selection from the group consisting of 1,3-propanediol, 1,4-butanediol, neopentyl glycol, 1,5-pentanediol, 1,6-hexanediol, and cyclohexanedimethanol as the chain extender.

The present invention also encompasses the aforesaid polymer material wherein the weight ratio between the weight of the polymer diol and the total weight of the organic diisocyanate and chain extender is [weight of the polymer diol]:[total weight of the organic diisocyanate and the chain extender]=10:90 to 50:50.

The present invention also encompasses a foam obtained by foaming the aforesaid polymer material.

The present invention also encompasses the aforesaid foam wherein the foam is obtained by dissolving a nonreactive gas in the aforesaid polymer material under elevated pressure conditions; thereafter releasing the pressure at a temperature that is lower than the softening temperature for taking out under atmospheric pressure, and then foaming the polymer material at a temperature that is greater than or equal to the softening temperature.

The present invention also encompasses the aforesaid foam wherein the nonreactive gas is carbon dioxide or nitrogen.

The present invention also encompasses a polishing pad that contains the aforesaid polymer material.

The present invention also encompasses a polishing pad that contains the aforesaid foam.

As a result of extensive investigations directed to achieving the preceding objects, the present inventors also discovered that the sought after characteristics are exhibited by a polishing pad in which there are layered a polishing layer comprising a polymer material, such as polyurethane, that has a specific tensile modulus, loss tangent, and contact angle with water and a soft elastic layer. The present invention was achieved based on this discovery.

That is, the present invention encompasses a polishing pad in which a polishing layer comprising the aforesaid polymer material and an elastic layer having a hardness lower than that of the polishing layer are layered.

The present invention also encompasses a polishing pad in which a polishing layer comprising the aforesaid foam and an elastic layer having a hardness lower than that of the polishing layer are layered.

The present invention also encompasses the aforesaid polishing pad wherein the polishing layer has a JIS-D hardness of at least 55, and the elastic layer has a JIS-C hardness of 20 to 80.

The present invention also encompasses the aforesaid polishing pad wherein the thickness of the polishing layer is 0.3 to 2 mm, and the thickness of the elastic layer is 0.5 to 3 mm.

The present invention also encompasses the aforesaid polishing pad wherein the elastic layer is formed from polyurethane.

The present invention further encompasses a method of polishing a silicon wafer or semiconductor wafer using the aforesaid polishing pad.

The present invention also provides a method of producing a semiconductor device using the aforesaid polishing pad.

In preferred embodiments, the present invention can provide, for example, a polymer material useful for chemical mechanical polishing and a foam obtained from this polymer material that is also useful for chemical mechanical polishing. Furthermore, through the application of this polymer material and foam, for example, a polishing pad can be provided that is capable of the high-precision polishing of semiconductor wafers and the like and that also exhibits a stable polishing rate and produces little scratching during wafer polishing.

In another preferred embodiment, the present invention can provide, for example, a multilayer polishing pad that is useful for chemical mechanical polishing. This multilayer polishing pad in particular provides an excellent polishing uniformity during polishing.

BEST MODE FOR CARRYING OUT THE INVENTION

The polymer material of the present invention satisfies the following: tensile modulus at 50° C. after saturation swelling with 50° C. water of 130 to 800 MPa, loss tangent at 50° C. of not more than 0.2, and contact angle with water of not more than 80°. The polishing pad of the present invention contains this polymer material or a foam obtained by foaming this polymer material. The polishing pad will be too soft when the tensile modulus of the polymer material (the value at 50° C. after saturation swelling with 50° C. water) is less than 130 MPa, and as a result the planarity of the polished surface will be reduced and the polishing efficiency will also be reduced. Scratch generation increases when, on the other hand, the tensile modulus of the polymer material (the value at 50° C. after saturation swelling with 50° C. water) is larger than 800 MPa. For example, viewed from the perspective of the planarity of the polished surface and scratch prevention, the tensile modulus of the polymer material (the value at 50° C. after saturation swelling with 50° C. water) is preferably in the range of 180 to 750 MPa, more preferably in the range of 230 to 700 MPa, and even more preferably in the range of 280 to 650 MPa.

The polishing pad will be too soft when the loss tangent (value of tan δ) at 50° C. of the polymer material exceeds 0.2, and as a result the planarity of the polished surface will be reduced and the polishing efficiency will also be reduced. For example, viewed from the perspective of the planarity of the polished surface, the loss tangent (value of tan δ) at 50° C. of the polymer material is preferably not more than 0.15 and more preferably is not more than 0.10. The loss tangent at 50° C. (value of tan δ) is the ratio ($E''_{50}/E''_{50}$) between the loss modulus at 50° C. ($E''_{50}$) and the storage modulus at 50° C. ($E'_{50}$).

Scratching is readily produced when the contact angle with water of the polymer material exceeds 80°. For example, viewed from the perspective of scratch prevention, the contact angle with water of the polymer material is preferably not more than 75° and more preferably is not more than 70°.

The polymer material of the present invention also encompasses polymer material that has a retention of tensile modulus (a value obtained by dividing the tensile modulus at 50° C. after saturation swelling with 50° C. water by a tensile modulus at 50° C. after being allowed to stand at 20° C./65% RH and multiplying by 100) of at least 55%. When the retention of tensile modulus is less than 55% and the polymer material is used, for example, as a polishing pad, the pad will then exhibit large water-induced variations in its polishing characteristics. For example, the polishing rate may be reduced when the pad is held after polishing is finished for several hours to several days while damp. Accordingly, viewed from the perspective of the influence due to moisture, the retention of tensile modulus is preferably at least 60% and more preferably is at least 75%.

The polymer material of the present invention also encompasses polymer material that has a ratio $E'_{23}/E'_{50}$ between a storage modulus at 23° C. ($E'_{23}$) and a storage modulus at 50° C. ($E'_{50}$) of not more than 1.8. When the ratio $E'_{23}/E'_{50}$ is larger than 1.8, for example, the polishing characteristics, e.g., the polishing rate and so forth, of a polishing pad comprising this polymer material will vary as a function of temperature, which sets up a tendency for it to be difficult to obtain a uniform quality during wafer polishing. Accordingly, viewed from the perspective of obtaining a polishing pad that exhibits a constant polishing rate, the ratio $E'_{23}/E'_{50}$ is preferably not more than 1.7 and more preferably is not more than 1.4.

The polymer material of the present invention also encompasses polyurethane obtained by reacting a polymer diol, an organic diisocyanate, and a chain extender. In addition, the polymer material of the present invention encompasses polymer material in which this polyurethane is a melt-moldable thermoplastic polyurethane and the content of nitrogen atom derived from the isocyanate group is at least 4.8 weight % but less than 6.0 weight %. When the content of nitrogen atom is less than 4.8 weight % and the polyurethane is used, for example, as a polishing pad, the polishing pad will be soft and the planarity of the polished surface will then tend to decline and the polishing efficiency will also tend to decline. On the other hand, scratching tends to easily occur when the content of nitrogen atom is 6.0 weight % or more. Accordingly, viewed from the perspective of scratch prevention, the content of nitrogen atom derived from the isocyanate group is preferably at least 4.9 weight % but not more than 5.8 weight % and more preferably is at least 5.0 weight % but not more than 5.6 weight %.

The materials that produce the polyurethane under consideration, that is, the polymer diol, organic diisocyanate, and chain extender, will be described in detail.

The polymer diol can be exemplified by polyether diols, polyester diols, and polycarbonate diols. A single one of these polymer diols may be used or two or more may be used in combination. The use is preferred thereamong of polyether diol and/or polyester diol.

The polyether diol can be exemplified by poly(ethylene glycol), poly(propylene glycol), poly(tetramethylene glycol), poly(methyltetramethylene glycol), poly(trimethylene glycol), glycerol-based polyalkylene ether glycol, and so forth. A single one of these polyether glycols may be used or two or more may be used in combination. The use is preferred thereamong of poly(ethylene glycol) and poly(tetramethylene glycol).

The polyester diol can be produced, for example, by a direct esterification reaction or a transesterification reaction, carried out by the usual methods, between a dicarboxylic acid or an ester-forming derivative thereof (e.g., an ester, anhydride, and so forth) and a low molecular weight diol.

The dicarboxylic acid constituent of the polyester diol can be exemplified by aliphatic dicarboxylic acids, e.g., $C_{2-12}$ aliphatic dicarboxylic acids such as oxalic acid, succinic acid, glutaric acid, adipic acid, pimelic acid, suberic acid, azelaic acid, sebacic acid, dodecanedicarboxylic acid, 2-methylsuccinic acid, 2-methyladipic acid, 3-methyladipic acid, 3-methylpentanedioic acid, 2-methyloctanedioic acid, 3,8-dimethyldecanedioic acid, 3,7-dimethyldecanedioic acid, and so forth, and also $C_{14-48}$ dimerized aliphatic dicarboxylic acids (dimer acids) as afforded by the dimerization of unsaturated fatty acids obtained by the fractional distillation of triglycerides, as well as the hydrogenated products from these $C_{14-48}$ dimerized aliphatic dicarboxylic acids (hydrogenated dimer acids); alicyclic dicarboxylic acids such as 1,4-cyclohexanedicarboxylic acid; and aromatic dicarboxylic acids such as terephthalic acid, isophthalic acid, ortho-phthalic acid, and so forth. A single one of these dicarboxylic acids may be used or two or more may be used in combination. For example, Pripol 1004, Pripol 1006, Pripol 1009, and Pripol 1013 (trade names, from Unichema) can be used as the dimer acid and hydrogenated dimer acid.

The low molecular weight diol constituent of the polyester diol can be exemplified by aliphatic diols such as ethylene glycol, 1,3-propanediol, 1,2-propanediol, 2-methyl-1,3-propanediol, 1,4-butanediol, neopentyl glycol, 1,5-pentanediol, 3-methyl-1,5-pentanediol, 1,6-hexanediol, 1,7-heptanediol, 1,8-octanediol, 2-methyl-1,8-octanediol, 1,9-nonanediol, 1,10-decanediol, and so forth, and by alicyclic diols such as cyclohexanedimethanol, cyclohexanediol, and so forth. A single one of these low molecular weight diols may be used or two or more may be used in combination. Among the preceding diols, $C_{6-12}$ diols are preferably used, $C_{8-10}$ diols are more preferably used, and $C_9$ diols are even more preferably used.

Polycarbonate diols obtained by the reaction of a low molecular weight diol and a carbonate compound (e.g., a dialkyl carbonate, alkylene carbonate, diaryl carbonate, and so forth) can be used as the polycarbonate diol under consideration. The low molecular weight diols provided previously as examples of the low molecular weight diol constituent component of the polyester diol can be used as the low molecular weight diol constituent of the polycarbonate diol. The dialkyl carbonate can be exemplified by dimethyl carbonate, diethyl carbonate, and so forth. The alkylene carbonate can be exemplified by ethylene carbonate and so forth. The diaryl carbonate can be exemplified by diphenyl carbonate and so forth.

A single polymer diol can be used as the polymer diol used for the polyurethane of the present invention or two or more can be used in combination; however, the number-average molecular weight of at least one of the polymer diols is preferably 1400 to 5000. The obtained polyurethane has a high modulus when the number-average molecular weight of the polymer diol is less than 1400 and there is then a tendency for scratching to occur easily. On the other hand, when the number-average molecular weight of the polymer diol exceeds 5000, this causes a viscosity increase in the molder during molding by extrusion or injection molding with the production of infusible material, which may require that the molding operation be stopped and the interior cleaned. Viewed, for example, from the perspective of producing a polyurethane that has a very suitable modulus while avoiding the generation of a viscosity increase during extrusion or injection molding, at least one of the polymer diols used has a number-average molecular weight in the range preferably of 1400 to 4000 and more preferably 2000 to 3500. The number-average molecular weight referenced in this Description with regard to the polymer diol in all instances denotes the number-average molecular weight calculated based on the hydroxyl value measured in accordance with JIS K 1557.

Although this is in no way limiting, the polymer material of the present invention can be readily obtained using a thermoplastic polyurethane that is itself obtained using a polymer diol with a number-average molecular weight of 1400 to 5000 and that has a content of nitrogen atom derived from the isocyanate group of at least 4.8 weight % but less than 6.0 weight %, and this approach is therefore preferred.

The organic diisocyanate used to produce the polyurethane in the present invention may be any of the organic diisocyanates heretofore used to produce the usual polyurethanes, and can be exemplified by aliphatic and alicyclic diisocyanates such as ethylene diisocyanate, tetramethylene diisocyanate, pentamethylene diisocyanate, hexamethylene diisocyanate, 2,2,4- or 2,4,4-trimethylhexamethylene diisocyanate, dodecamethylene diisocyanate, isophorone diisocyanate, isopropylidenebis(4-cyclohexyl isocyanate), cyclohexylmethane diisocyanate, methylcyclohexane diisocyanate, 4,4'-dicyclohexylmethane diisocyanate, lysine diisocyanate, 2,6-diisocyanatomethyl caproate, bis(2-isocyanatoethyl) fumarate, bis(2-isocyanatoethyl) carbonate, 2-isocyanatoethyl 2,6-diisocyanatohexanoate, cyclohexylene diisocyanate, methylcyclohexylene diisocyanate, bis(2-isocyanatoethyl)-4-cyclohexene, and so forth, and by aromatic diisocyanates such as 2,4'- or 4,4'-diphenylmethane diisocyanate, 2,4- or 2,6-tolylene diisocyanate, m- or p-phenylene diisocyanate, m- or p-xylylene diisocyanate, 1,5-naphthylene diisocyanate, 4,4'-diisocyanatobiphenyl, 3,3'-dimethyl-4,4'-diisocyanatobiphenyl, 3,3'-dimethyl-4,4'-diisocyanatodiphenylmethane, chlorophenylene-2,4-diisocyanate, tetramethylxylylene diisocyanate, and so forth. A single one of these organic diisocyanates can be used or two or more can be used in combination. 4,4'-diphenylmethane diisocyanate is preferred among the preceding from the standpoint of the wear resistance of the resulting polishing pad.

Any of the chain extenders heretofore used for the production of the usual polyurethanes can be used as the chain extender used to produce the polyurethane of the present invention. The chain extender preferably takes the form of a low molecular weight compound that has a molecular weight not more than 300 and that has in its molecule at least two active hydrogen atoms capable of reacting with the isocyanate group; this chain extender can be nonexhaustively exemplified by diols such as ethylene glycol, diethylene glycol, 1,2-propanediol, 1,3-propanediol, 2,2-diethyl-1,3-propanediol, 1,2-, 1,3-, 2,3- or 1,4-butanediol, 1,5-pentanediol, neopentyl glycol, 1,6-hexanediol, 3-methyl-1,5-pentanediol, 1,4-bis(β-hydroxyethoxy)benzene, 1,4-cyclohexanediol, cyclohexanedimethanol (1,4-cyclohexanedimethanol and so forth), bis(β-hydroxyethyl) terephthalate, 1,9-nonanediol, m- or p-xylylene glycol, and so forth, and also by diamines such as ethylenediamine, trimethylenediamine, tetramethylenediamine, hexamethylenediamine, heptamethylenediamine, octamethylenediamine, nonamethylenediamine, decamethylenediamine, undecamethylenediamine, dodecamethylenediamine, 2,2,4-trimethylhexamethylenediamine, 2,4,4-trimethylhexamethylenediamine, 3-methylpentamethylenediamine, 1,2-cyclohexanediamine, 1,3-cyclohexanediamine, 1,4-cyclohexanediamine, 1,2-diaminopropane, 1,3-diaminopropane, hydrazine, xylylenediamine, isophoronediamine, piperazine, o-, m-, or p-phenylenediamine, tolylenediamine, xylylenediamine, adipic acid dihydrazide, isophthalic acid dihydrazide, 4,4'-diaminodiphenylmethane, 4,4'-diaminodiphenyl ether, 4,4'-bis(4-aminophenoxy)biphenyl, 4,4'-bis(3-aminophenoxy)biphenyl, 1,4-bis(4-aminophenoxy)benzene, 1,3-bis(4-aminophenoxy)benzene, 1,3-bis(3-aminophenoxy)benzene, 3,4'-diaminodiphenyl ether, 4,4'-diaminodiphenyl sulfone, 3,4-diaminodiphenyl sulfone, 3,3'-diaminodiphenyl sulfone, 4,4'-methylenebis(2-chloroaniline), 3,3'-dimethyl-4,4'-diaminobiphenyl, 4,4'-diaminodiphenyl sulfide, 2,6-diaminotoluene, 2,4-diaminochlorobenzene, 1,2-diaminoanthraquinone, 1,4-diaminoanthraquinone, 3,3'-diaminobenzophenone, 3,4-diaminobenzophenone, 4,4'-diaminobenzophenone, 4,4'-diaminobibenzyl, 2,2'-diamino-1,1'-binaphthalene, 1,n-bis(4-aminophenoxy)alkanes (n=3-10, e.g., 1,3-bis(4-aminophenoxy)alkane, 1,4-bis(4-aminophenoxy)alkane, 1,5-bis(4-aminophenoxy)alkane, and so forth), 1,2-bis[2-(4-aminophenoxy)ethoxy]ethane, 9,9-bis(4-aminophenyl)fluorene, 4,4'-diaminobenzanilide, and so forth. A single one of these chain extenders may be used, or two or more may be used in combination.

The polyurethane in the present invention can be specifically exemplified by the polymer material obtained by reacting at least one polymer diol selected from the group consisting of poly(ethylene glycol), poly(tetramethylene glycol), poly(nonamethylene adipate), poly(2-methyl-1,8-octamethylene adipate), poly(2-methyl-1,8-octamethylene-co-nonamethylene adipate), and poly(methylpentane adipate), at least one organic diisocyanate selected from the group consisting of 4,4'-diphenylmethane diisocyanate, 2,4-tolylene diisocyanate, 2,6-tolylene diisocyanate, and isophorone diisocyanate and at least one chain extender selected from the group consisting of 1,3-propanediol, 1,4-butanediol, neopentyl glycol, 1,5-pentanediol, 1,6-hexanediol, and cyclohexanedimethanol.

The method of producing this polyurethane is not particularly limited; however, the following method is an example of the production of a crosslinked polyurethane: the aforementioned polymer diol and organic diisocyanate are mixed in a range such that the number of moles of the organic diisocyanate is a 1.5- to 3.0-fold excess (preferably a 1.8- to 2.7-fold excess and more preferably a 2.0- to 2.5-fold excess) relative to the number of moles of the polymer diol; a reaction is carried out at 60 to 120° C. (preferably 70 to 110° C. and more preferably 80 to 100° C.) to synthesize an intermediate polymer; and this intermediate polymer is dissolved in an inert solvent, such as N,N-dimethylacetamide or N,N-dimethylformamide, and a chain extension reaction is carried out by reaction with an organic diamine.

With regard to the production of the thermoplastic polyurethane, production can be carried out by melt-mixing the aforementioned polymer diol, organic diisocyanate, and chain extender in prescribed proportions. The mixing proportions of the individual components are appropriately selected taking into consideration the properties to be imparted to the thermoplastic polyurethane, the wear resistance, and so forth; however, the use is preferred of the individual components at proportions that provide 0.95 to 1.3 moles of the isocyanate group present in the organic diisocyanate per 1 mole active hydrogen atom present in the polymer diol and the chain extender. The resulting thermoplastic polyurethane and the foam obtained by foaming it exhibit a declining mechanical strength and a declining wear resistance when the proportion of the isocyanate group is less than 0.95 mole. There is a tendency for the productivity, storage stability, and foamability of the thermoplastic polyurethane to decline when the proportion of the isocyanate group is more than 1.3 moles.

For example, viewed from the perspective of the mechanical strength and wear resistance of the obtained thermoplastic polyurethane and foam and from the perspective of the productivity, storage stability, and foamability of the polyurethane, the isocyanate group present in the organic diisocyanate is more preferably in the range of 0.96 to 11.10 and even more preferably in the range of 0.97 to 1.05, in each case per 1 mole active hydrogen atom present in the polymer diol and the chain extender.

To provide a polymer material having the desired properties, the prescribed proportions among the polymer diol, organic diisocyanate, and chain extender, expressed in terms of the weight ratio between the weight of the polymer diol and the total weight of the organic diisocyanate and the chain extender, are preferably [weight of the polymer diol]:[total weight of the organic diisocyanate and the chain extender]=10:90 to 50:50 and more preferably =15:85 to 40:60.

The method of producing the thermoplastic polyurethane is not particularly limited, and it may be produced by a prepolymer method or a one-shot method utilizing the known urethanation reactions and the three components described above. The thermoplastic polyurethane is preferably produced by a melt-polymerization method substantially in the absence of solvent and more preferably is produced by a continuous melt-polymerization method using a multi-screw extruder.

The polymer material of the present invention, for example, the polyurethane described in the preceding, can be made into a molding using various molding methods, for example, extrusion molding, injection molding, blow molding, calender molding, and so forth. The shape of the molding is not particularly limited, but can be exemplified by sheet-form moldings, film-form moldings, plate-form moldings, fibrous materials, and so forth. When a sheet-form or film-form molding is sought, the use of a molding technique that uses a T-die is preferred because this yields a sheet-form or film-form molding of uniform thickness.

The polymer material of the present invention can be used as a constituent material of a polishing pad. For example, it can be used as a polishing pad that contains the polymer material of the present invention and in particular can be used as a polishing pad that contains the polymer material of the present invention and that substantially does not have a foam structure and that produces very little scratching.

The polymer material of the present invention may be foamed to give a foam. The present invention additionally compasses a polishing pad that contains this foam (also referred to hereafter as the foam polishing pad).

The cell count in this foam, for example, when made into a foam polishing pad, viewed from the perspective of preventing the decline in polishing efficiency due to clogging of the cells by the polishing agent present in the polishing slurry, preventing polishing defects such as scratches, and retention of the polishing slurry, is preferably not more than 6000/mm$^2$, more preferably not more than 5000/mm$^2$, even more preferably not more than 4500/mm$^2$, and particularly preferably not more than 4000/mm$^2$.

The average cell size, viewed, for example, from the perspective of polishing slurry retention and preventing polishing defects such as scratches, is preferably in the range from 5 to 60 μm and more preferably is in the range from 10 to 50 μm. The foam has a density preferably in the range from 0.40 to 10.10 g/cm$^3$ and more preferably in the range from 0.50 to 1.00 g/cm$^3$.

The foam of the present invention can be produced by foaming the polymer material, for example, the previously described polyurethane. Foaming can be carried using, for example, a thermal decomposition-type foaming agent (chemical foaming agent) and/or a physical foaming agent such as a nonreactive gas; the use of a nonreactive gas as the foaming agent is preferred. A nonreactive gas denotes a gas that does not react with the components used to produce the polymer material, for example, the polyurethane. The nonreactive gas can be exemplified by nitrogen, carbon dioxide, argon, helium, and so forth. Carbon dioxide and nitrogen are preferred thereamong from the standpoints of production costs and solubility in the polymer material, polyurethane, and thermoplastic polyurethane.

The foam of the present invention can be produced by dissolving the aforementioned nonreactive gas in the polymer material, e.g., the aforementioned polyurethane, under elevated pressure conditions and thereafter releasing the pressure and foaming at a temperature greater than or equal to the softening temperature of the polymer material, e.g., polyurethane. Considered from the perspective, for example, of obtaining a foam that has a uniform cell structure, the amount of nonreactive gas dissolution is preferably at least 98% of the saturation amount under the conditions of dissolution and more preferably is at least 99% of the saturation amount and even more preferably is the saturation amount.

The use of a sheet-form molding as the polymer material, e.g., polyurethane, that will dissolve the nonreactive gas is advantageous because this makes it easy to produce a foam having a uniform foam structure and enables simplification of the process when the foam polishing pad is made. This sheet-form molding is preferably obtained by molding the polymer material, e.g., polyurethane, using an injection molder or an extrusion molder, for example, a single-screw extruder or a twin-screw extruder. Considering, for example, the ease of producing the foam and the time required for dissolution of the nonreactive gas, the sheet-form molding preferably has a thickness of 0.8 to 5 mm and more preferably of 1 to 4 mm.

The method of producing a foam product by dissolving a gas in a thermoplastic resin or molding thereof and then lowering the pressure is described in, for example, U.S. Pat. No. 4,473,665 and Japanese Patent Application Laid-open Numbers Hei 06-322168, Hei 08-011190, Hei 10-036547, 2000-169615, and 2000-248101, and the foam can be produced by these methods.

The foam of the present invention can be produced by carrying out foaming by dissolving a nonreactive gas in the polymer material (or molding thereof), e.g., polyurethane, in a pressure-resistant container that has been brought to a pressure of 3 to 15 MPa and a temperature of 50 to 160° C.; releasing the pressure at a temperature that is lower than the softening temperature of the polymer material; and heating this polymer material (or molding thereof) to a temperature that is greater than or equal to the softening temperature of the polymer material.

The size of the produced cells depends on the amount of nonreactive gas dissolution, although it also depends on the composition of the polymer material, e.g., polyurethane. The amount of nonreactive gas dissolution can be adjusted through the pressure and temperature during dissolution. When the pressure during dissolution of the nonreactive gas is less than 3 MPa, a long period of time is then required to achieve dissolution of the saturation amount of nonreactive gas in the polymer material, e.g., polyurethane. When, on the other hand, the pressure during dissolution of the nonreactive gas exceeds 15 MPa, the time required for dissolution of the nonreactive gas is short, but the amount of gas dissolved will be larger than necessary and the size of the produced cells will be substantially reduced. The pressure during dissolution of the nonreactive gas is preferably 5 to 14 MPa, more preferably is 6 to 13 MPa, and even more preferably is 7 to 12 MPa. When the temperature during dissolution of the nonreactive gas is less than 50° C., a long period of time is then required to achieve dissolution of the saturation amount of nonreactive gas in the polymer material (or molding thereof), e.g., polyurethane. When, on the other hand, the temperature during dissolution of the nonreactive gas exceeds 160° C., bubbles will be produced to some extent upon pressure release and/or the amount of nonreactive gas dissolution is drastically reduced and the size of the produced bubbles becomes overly large. The temperature during nonreactive gas dissolution is preferably 70 to 150° C., more preferably is 80 to 140° C., and even more preferably is 90 to 130° C.

The problem of the production of nonuniform cells at the time of pressure release and hence difficulty in obtaining a uniform foam occurs when the temperature at the time of pressure release after dissolution of the nonreactive gas in the polymer material (or molding thereof) is greater than or equal to the softening temperature of the polymer material. Viewed, for example, from the standpoint of obtaining a foam that has a uniform foam structure, the temperature at the time of pressure release is preferably not greater than 50° C., more preferably is not greater than 40° C., and even more preferably is not greater than 30° C. In this Description, the softening temperature of the polymer material denotes the temperature at which the polymer material softens and in this Description denotes the temperature at which the storage modulus (E') reaches $1 \times 10^7$ Pa.

Cell production and cell growth are inadequate when the post-pressure release heating temperature for the polymer material (or molding thereof) containing dissolved nonreactive gas is less than the softening temperature of the polymer material, e.g., polyurethane. From the standpoint of the size of the produced cells and foam strength, the polymer material (or molding thereof) containing dissolved nonreactive gas is heated to a temperature preferably in the range from $(T-15)°$ C. to $(T+40)°$ C., more preferably in the range of $(T-10)°$ C. to $(T+35)°$ C., and even more preferably in the range of $(T-5)°$ C. to $(T+30)°$ C., where $T°$ C. is the softening temperature of the polymer material, e.g., polyurethane. The heating/foaming method is not limited, but a method in which the heat is uniformly applied to the polymer material (or molding thereof) containing dissolved nonreactive gas is preferred from the standpoint of securing a uniform foam structure. The heating/foaming method can be exemplified by passage into and through a heating medium such as hot water, a hot oil bath, a hot gas current, steam, and so forth, and by heating with an external heating device such as an infrared heater.

The polymer material of the present invention as such can be a polishing pad or can be made into a polishing pad through the implementation of desired processing. For example, as described above, the polymer material of the present invention can be made into a sheet-form molding by, for example, extrusion molding or injection molding, and this can be a polishing pad. In addition, the foam of the present invention as such can be a polishing pad (foam polishing pad) or can be made into a polishing pad (foam polishing pad) through the implementation of desired processing. The type of the aforementioned processing during preparation of the polishing pad is not particularly limited; examples of this processing include processes in which the shape is adjusted, for example, by grinding or slicing, and surface processing in which holes or grooves (e.g., lattice shaped, concentric circular shaped, spiral shaped, and so forth) are formed in the surface of the polishing pad.

A polishing pad containing the polymer material of the present invention may, within a range that does not impair the effects of the present invention, contain components other than the polymer material of the present invention. Similarly, the hereinabove-described foam polishing pad may also contain components other than the polymer material of the present invention within a range that does not impair the effects of the present invention. These other components can be exemplified by additives such as crosslinkers, fillers, crosslinking accelerators, crosslinking auxiliaries, softeners, tack-imparting agents, ageing inhibitors, foaming agents, processing auxiliaries, adhesion promoters, inorganic fillers, organic fillers, crystal nucleating agents, heat stabilizers, weathering stabilizers, static inhibitors, colorants, lubricants, flame retardants, flame-retarding auxiliaries (e.g., antimony oxide), blooming inhibitors, release agents, thickeners, oxidation inhibitors, agents that impart electroconductivity, and so forth. The content of these other components in a polishing pad or foam polishing pad that contains the polymer material of the present invention is preferably not more than 50 weight %, more preferably is not more than 20 weight %, and even more preferably is not more than 5 weight %, and it is particularly preferred that the polishing pad and foam polishing pad of the present invention comprise substantially only the polymer material of the present invention or foam obtained by foaming the polymer material of the present invention.

A layered polishing pad can also be prepared by implementing a process, for example, in which a material forming a cushioning layer is laminated in the aforementioned polishing pad or foam polishing pad. A single such process can be employed or two or more may be combined.

For example, the present invention encompasses a polishing pad in which there are layered a polishing layer comprising the hereinabove-described polymer material and an elastic layer having a hardness lower than that of the polishing layer. The present invention also encompasses a polishing pad in which there are layered a polishing layer comprising the hereinabove-described foam and an elastic layer having a hardness lower than that of the polishing layer. The polishing uniformity during polishing is improved when the polishing pad has such an elastic layer. With regard to the specific hardness of the individual layers, the polishing layer preferably has a JIS-D hardness of at least 55 and the elastic layer preferably has a JIS-C hardness of 20 to 80. The polishing layer has a JIS-D hardness more preferably of 60 to 80 and even more preferably 65 to 75 because this provides an improved local planarity (localized planarity on the wafer) for the polished surface and because the generation of scratches in the polished surface is facilitated when the hardness is overly high. On the other hand, the elastic layer has a JIS-C hardness more preferably of 30 to 70 and even more preferably 40 to 60 because this provides an improved global planarity (planarity over the wafer surface) and because, when this hardness is overly low, it may not be possible to carry out stable polishing because the platen rotation cannot be satisfactorily transferred to the polishing layer when the pad is bonded on the platen and polishing is carried out.

This layered polishing pad encompasses layered polishing pads in which the aforementioned polishing layer and elastic layer are directly joined by, for example, melt adhesion, as well as polishing pads in which the two layers are bonded by, for example, an adhesive or two-sided pressure-sensitive tape, and polishing pads in which yet another layer is disposed between the two layers.

The thickness of the individual layers in the layered polishing pad is not particularly limited, and a polishing layer thickness of 0.3 to 2 mm and an elastic layer thickness of 0.5 to 3 mm are preferred. There is a tendency at a polishing layer thickness of less than 0.3 mm for the effect from the hardness of the polishing layer to be impaired and for the local planarity to be inferior as a result. There is a tendency at a polishing layer thickness in excess of 2 mm for the global planarizing effect brought about by the elastic layer to be diminished. The thickness of the polishing layer is more preferably 0.5 to 1.8 mm and even more preferably is 0.8 to 1.5 mm. On the other hand, a tendency appears at an elastic layer thickness of less than 0.5 mm for there to be little effect with regard to following the curvature of and undulations in the surface being polished and for the global planarity to be inferior. In addition, due to the excessive softness when the thickness of the elastic layer exceeds 3 mm, it may not be possible to carry out stable polishing because the platen rotation cannot be satisfactorily transferred to the polishing layer when the pad is bonded on the platen and polishing is carried out. The thickness of the elastic layer is more preferably 1 to 2.5 mm and even more preferably is 2 to 2.5 mm.

The elastic layer preferably has a foam structure in which the void ratio is 10 to 90%. As long as this range is obeyed, it is possible to carry out stable polishing due to the rebounding force within the voids compressed by the polishing pressure (head pressure) during polishing. A tendency appears at an elastic layer void ratio of less than 10% for there to be little effect with regard to following the curvature of and undulations in the surface being polished and for the global planarity to be inferior. In addition, due to the excessive softness when the elastic layer void ratio exceeds 90%, it may be difficult to carry out stable polishing because the platen rotation cannot be satisfactorily transferred to the polishing layer when the pad is bonded on the platen and polishing is carried out. The void ratio of the elastic layer is more preferably 20 to 70% and is even more preferably 30 to 60%.

The material of the elastic layer is not particularly limited and the following can be used: nonwoven fabric impregnated with a polyurethane as currently in general-purpose use (such a nonwoven fabric can be exemplified by Suba400 from Nitta Haas Incorporated); rubbers such as natural rubber, nitrile rubber, polybutadiene rubber, silicone rubber, and so forth; thermoplastic elastomers such as polyester-type thermoplastic elastomers, polyamide-type thermoplastic elastomers, fluorinated thermoplastic elastomers, and so forth; foamed plastics; polyurethanes; and so forth. Polyurethane is preferred because it is the preferred material for the polishing layer and because it can easily provide the softness required for the elastic layer and can easily provide a foam structure.

The polishing pad of the present invention (including the foamed polishing pad and the layered polishing pad, the same applies hereafter) can be used for chemical mechanical polishing (CNiP) in combination with a polishing slurry that is known as such. The polishing slurry can contain components such as, for example, a liquid medium, such as water, oil, and so forth; a polishing agent such as silica, aluminum oxide, cerium oxide, zirconium oxide, silicon carbide, and so forth; base; acid; surfactant; and so forth. As necessary, a lubricating oil, coolant, and so forth can be used in combination with the polishing slurry during CMP.

CMP can be carried out by contacting the polishing pad with the surface to be polished with the polishing slurry disposed therebetween, using a known CMP device, said contact being carried out with the application of pressure at a prescribed velocity and for a prescribed period of time. The article to be polished is not particularly limited and can be exemplified by quartz, silicon, glass, optical substrates, electronic circuit boards, printed wiring boards, hard disks, and so forth. Silicon wafers and semiconductor wafers are particularly preferred as articles to be polished. The semiconductor wafer can be specifically exemplified by semiconductor wafers having a dielectric layer (e.g., silicon oxide, silicon oxyfluoride, organic polymer, and so forth) on the surface, semiconductor wafers having a metal interconnect layer (e.g., copper, aluminum, tungsten, and so forth) on the surface, and semiconductor wafers having a barrier metal film (tantalum, titanium, tantalum nitride, titanium nitride, and so forth) on the surface.

EXAMPLES

The present invention is more specifically described in the examples provided below, but the present invention is in no way limited by these examples. The methods described below were used to evaluate the properties of the polyurethane and polishing pads referenced in the examples.

Storage Modulus (E') and Loss Modulus (E") (Loss Tangent (Value of tan δ) at 50° C. and Ratio $E'_{23}/E'_{50}$ Between the Storage Modulus at 23° C. and the Storage Modulus at 50° C.)

The storage modulus ($E'_{23}$ and $E'_{50}$) and loss modulus ($E''_{50}$) were determined by measuring the dynamic viscoelastic modulus at a frequency of 11 Hz and a temperature of 23° C. and 50° C. using a dynamic viscoelastic measurement instrument (DVE Rheospectra from the Rheology Co., Ltd.). The test specimen was obtained by fabricating a 2 mm-thick injection molded sheet and heat treating this sheet for 5 hours at 90° C. These values were used to calculate the loss tangent (value of tan δ) at 50° C. and the ratio $E'_{23}/E'_{50}$ between the storage modulus at 23° C. and the storage modulus at 50° C. The temperature at which the storage modulus (E') assumed a value of $1 \times 10^7$ Pa (the softening temperature) was determined by similar measurements.

Tensile Modulus at 50° C. (after Saturation Swelling with 50° C. Water and after being Allowed to Stand at 20° C./65% RH)

A no. 2 test specimen (JIS K 7113) was punched from a 300 μm-thick film that had been fabricated by hot pressing; the dry sample was then prepared by being allowed to stand for 3 days at 20° C./65% RH and the water-swollen sample was prepared by immersion for 3 days in 50° C. water. Each of these samples was submitted to measurement of the tensile modulus as follows: the sample was mounted using an interchuck distance of 40 mm in an Autograph AG5000 from Shimadzu Corporation, and the tensile modulus was measured at a pull rate of 50 mm/minute after standing for 5 minutes in a 50° C. ambient. The tensile modulus obtained using the dry sample was designated as the "tensile modulus at 50° C. after being allowed to stand at 20° C./65% RH" and the tensile modulus obtained using the water-swollen sample was designated as the "tensile modulus at 50° C. after saturation swelling with 50° C. water".

Contact Angle

This was measured using a DropMaster 500 from Kyowa Interface Science Co., Ltd., on 300 μm-thick film that had been fabricated by hot pressing and held for 3 days at 20° C./65% RH.

Cell Count, Average Cell Size, and Void Ratio

The foam cross section was photographed by scanning electron microscopy (SEM), the number of cells present in a prescribed area was counted; and the cell count per unit area (numerical cell density) was calculated. Using this value, the foam density measured as described below, and the density of the (unfoamed) polymer material, the average cell size was calculated assuming that the cells had a spherical shape. In addition, the density of the elastic layer was determined by the same measurement method as used for the polishing layer density, infra, and the void volume of the elastic layer was determined from this value and the density of the (unfoamed) material constituting the elastic layer. The void ratio (volume %) of the elastic layer was then determined by dividing this void volume by the volume of the elastic layer.

Density

The density of the polishing pad and the polishing layer were measured in accordance with JIS K 7112.

Hardness

The hardness of the polishing pad, polishing layer, and elastic layer were measured in accordance with JIS K 7311.

Scratch Count (Evaluation of Polishing Characteristics)

The number of scratches with a size greater than or equal to 0.16 μm present in the wafer surface after polishing was measured using a Surfscan SPI from KLA-Tencor.

Evaluation of the Polishing Uniformity

The film thickness of the silicon wafer before and after polishing was measured at 49 points over the wafer surface and the polishing rate was calculated at each point. The polishing rate (R) was designated as the average value of the polishing rate at the 49 points; the standard deviation (σ) on the polishing rate at the 49 points was determined; and the polishing uniformity was evaluated based on the nonuniformity calculated with the following equation (1).

$$\text{nonuniformity (\%)} = (\sigma/R) \times 100 \qquad (1)$$

In this case, smaller values for the nonuniformity are indicative of a better polishing uniformity.

The following elastic layers were used in the examples provided below.

Elastic Layer-1

Elastic polyurethane sheet with thickness=2 mm, JIS-C hardness=65, and void ratio=48 volume %. Poron H48 from the INOAC Corporation.

Elastic Layer-2

Elastic polyurethane sheet with thickness=2.5 mm, JIS-C hardness=30, and void ratio=86 volume %. This elastic polyurethane sheet with a thickness of 2.5 mm was obtained by slicing a 3 mm-thick sheet of Poron L32 from the INOAC Corporation.

Elastic Layer-3

Elastic polyurethane sheet with thickness=2 mm, JIS-C hardness=30, and void ratio=86 volume %. Poron L32 from the INOAC Corporation.

Elastic Layer-4

Elastic polyurethane sheet with thickness=2 mm, JIS-C hardness=70, and void ratio=48 volume %. Poron HH48 from the INOAC Corporation.

Example 1

A thermoplastic polyurethane was produced by continuous melt polymerization in which poly(tetramethylene glycol) with a number-average molecular weight of 2000 (abbreviation: PTMG2000), poly(2-methyl-1,8-octamethylene-co-nonamethylene adipate) with a number-average molecular weight of 2000 (abbreviation: PNOA2000, nonamethylene unit:2-methyl-1,8-octamethylene unit molar ratio=7:3), 1,4-cyclohexanedimethanol (abbreviation: CHDM), 1,4-butanediol (abbreviation: BD), and 4,4'-diphenylmethane diisocyanate (abbreviation: MDI) were continuously fed into a coaxially rotated twin-screw extruder (30 mmφ, L/D=36, cylinder temperature: 75 to 260° C.) using a metering pump at proportions such that the PTMG2000 PNOA2000:CHDM:BD:MDI weight ratio was 21.3:9.1:5.4:13.6:50.6 (the content of nitrogen atom:5.7 weight %) while using a total feed rate therefor of 300 g/minute. The resulting thermoplastic polyurethane melt was continuously extruded in strand form into water and was thereafter finely cut into pellets with a pelletizer; the pellets were dehumidified/dried for 20 hours at 70° C. to produce a thermoplastic polyurethane (referred to below as PU-1). The tensile modulus at 50° C. after saturation swelling with 50° C. water, the tensile modulus at 50° C. after being allowed to stand at 20° C./65% RH, the retention of tensile modulus, the ratio $E'_{23}/E'_{50}$ between the storage modulus at 23° C. and the storage modulus at 50° C., the loss tangent at 50° C., and the contact angle with water of this PU-1 are shown in Table 1.

Example 2

A thermoplastic polyurethane was produced by continuous melt polymerization in which poly(2-methyl-1,8-octamethylene-co-nonamethylene adipate) with a number-average molecular weight of 2000 (abbreviation: PNOA2000, nonamethylene unit: 2-methyl-1,8-octamethylene unit molar ratio=7:3), polyethylene glycol with a number-average molecular weight of 600 (abbreviation: PEG600) 1,4-cyclohexanedimethanol (abbreviation: CRDM), 1,4-butanediol (abbreviation: BD), and 4,4'-diphenylmethane diisocyanate (abbreviation: MDI) were continuously fed into a coaxially rotated twin-screw extruder (30 mmφ, L/D=36, cylinder temperature: 75 to 260° C.) using a metering pump at proportions such that the PNOA2000 PEG600:CHDM:BD:MDI weight ratio was 31.0:5.0:2.4:13.6:48.0 (the content of nitrogen atom: 5.4 weight %) while using a total feed rate therefor of 300 g/minute. The resulting thermoplastic polyurethane melt was continuously extruded in strand form into water and was thereafter finely cut into pellets with a pelletizer; the pellets were dehumidified/dried for 20 hours at 70° C. to produce a thermoplastic polyurethane (referred to below as PU-2). The tensile modulus at 50° C. after saturation swelling with 50° C. water, the tensile modulus at 50° C. after being allowed to stand at 20° C./65% RH, the retention of tensile modulus, the ratio $E'_{23}/E'_{50}$ between the storage modulus at 23° C. and the storage modulus at 50° C., the loss tangent at 50° C., and the contact angle with water of this PU-2 are shown in Table 1 The softening temperature of PU-2 was 157° C.

Example 3

A thermoplastic polyurethane was produced by continuous melt polymerization in which poly(tetramethylene glycol) with a number-average molecular weight of 1400 (abbreviation: PTMG1400), 1,4-cyclohexanedimethanol (abbreviation: CHDM), and 4,4'-diphenylmethane diisocyanate (abbreviation: MDI) were continuously fed into a coaxially rotated twin-screw extruder (30 mmφ, L/D=36, cylinder temperature: 75 to 260° C.) using a metering pump at proportions such that the PTMG1400:CHDM:MDI weight ratio was 19.0:28.3:52.7 (the content of nitrogen atom:5.9 weight %) while using a total feed rate therefor of 300 g/minute. The resulting thermoplastic polyurethane melt was continuously extruded in strand form into water and was thereafter finely cut into pellets with a pelletizer; the pellets were dehumidified/dried for 20 hours at 70° C. to produce a thermoplastic polyurethane (referred to below as PU-3). The tensile modulus at 50° C. after saturation swelling with 50° C. water, the tensile modulus at 50° C. after being allowed to stand at 20° C./65% RH, the retention of tensile modulus, the ratio $E'_{23}/E'_{50}$ between the storage modulus at 23° C. and the storage modulus at 50° C., the loss tangent at 50° C., and the contact angle with water of this PU-3 are shown in Table 1. The softening temperature of PU-3 was 125° C.

Comparative Example 1

A thermoplastic polyurethane was produced by continuous melt polymerization in which poly(methylpentane adipate) with a number-average molecular weight of 500 (abbreviation: PMPA500), 1,4-cyclohexanedimethanol (abbreviation: CHDM), and 4,4'-diphenylmethane diisocyanate (abbreviation: MDI) were continuously fed into a coaxially rotated twin-screw extruder (30 mmφ, L/D=36, cylinder temperature: 75 to 260° C.) using a metering pump at proportions such that the PMPA500:CHDM:MDI weight ratio was 5.9: 33.3:60.8 (the content of nitrogen atom: 6.8 weight %) while using a total feed rate therefor of 300 g/minute. The resulting thermoplastic polyurethane melt was continuously extruded in strand form into water and was thereafter finely cut into pellets with a pelletizer; the pellets were dehumidified/dried for 20 hours at 70° C. to produce a thermoplastic polyurethane (referred to below as PU-4). The tensile modulus at 50° C. after saturation swelling with 50° C. water, the tensile modulus at 50° C. after being allowed to stand at 20° C./65% RH, the retention of tensile modulus, the ratio $E'_{23}/E'_{50}$ between the storage modulus at 23° C. and the storage modulus at 50° C., the loss tangent at 50° C., and the contact angle with water of this PU-4 are shown in Table 2. The softening temperature of PU-4 was 130° C.

Comparative Example 2

A thermoplastic polyurethane was produced by continuous melt polymerization in which dimer diol with a number-average molecular weight of 550 (abbreviation: DD550), 1,4-cyclohexanedimethanol (abbreviation: CHDM), and 4,4'-diphenylmethane diisocyanate (abbreviation: MDI) were continuously fed into a coaxially rotated twin-screw extruder (30 mmφ, L/D=36, cylinder temperature: 75 to 260° C.) using a metering pump at proportions such that the DD550:CHDM:MDI weight ratio was 24.8:23.3:51.9 (the content of nitrogen atom: 5.8 weight %) while using a total feed rate therefor of 300 g/minute. The resulting thermoplastic polyurethane melt was continuously extruded in strand form into water and was thereafter finely cut into pellets with a pelletizer; the pellets were dehumidified/dried for 20 hours at 70° C. to produce a thermoplastic polyurethane (referred to below as PU-5). The tensile modulus at 50° C. after saturation swelling with 50° C. water, the tensile modulus at 50° C. after being allowed to stand at 20° C./65% RH, the retention of tensile modulus, the ratio $E'_{23}/E'_{50}$ between the storage modulus at 23° C. and the storage modulus at 50° C., the loss tangent at 50° C., and the contact angle with water of this PU-5 are shown in Table 2. The softening temperature of PU-5 was 121° C.

Comparative Example 3

A thermoplastic polyurethane was produced by continuous melt polymerization in which poly(tetramethylene glycol) with a number-average molecular weight of 1000 (abbreviation: PTMG1000), 1,4-cyclohexanedimethanol (abbreviation: CHDM), and 4,4'-diphenylmethane diisocyanate (abbreviation: MDI) were continuously fed into a coaxially rotated twin-screw extruder (30 mmφ, L/D=36, cylinder temperature: 75 to 260° C.) using a metering pump at proportions such that the PTMG1000:CHDM:MDI weight ratio was 30.0:22.8:47.2 (the content of nitrogen atom: 5.3 weight %) while using a total feed rate therefor of 300 g/minute. The resulting thermoplastic polyurethane melt was continuously extruded in strand form into water and was thereafter finely cut into pellets with a pelletizer; the pellets were dehumidified/dried for 20 hours at 70° C. to produce a thermoplastic polyurethane (referred to below as PU-6). The tensile modulus at 50° C. after saturation swelling with 50° C. water, the tensile modulus at 50° C. after being allowed to stand at 20° C./65% RH, the retention of tensile modulus, the ratio $E'_{23}/E'_{50}$ between the storage modulus at 23° C. and the storage modulus at 50° C., the loss tangent at 50° C., and the contact angle with water of this PU-6 are shown in Table 2. The softening temperature of PU-6 was 75° C.

Example 4

Thermoplastic polyurethane (PU-1) was charged to a singe-screw extrusion molder (90 mmφ) and was extruded from a T-die at a cylinder temperature of 215 to 225° C. and a die temperature of 225° C. and was then passed through rolls that had a 1.8 mm gap and were thermostatted to 60° C. to mold a sheet having a thickness of 2 mm. The surface of the resulting sheet was ground to give a uniform sheet having a thickness of 1.5 mm; a circular polishing pad (pad 1) having a diameter of 51 cm was then fabricated by forming grooves (width=2.2 mm, depth=1.2 mm) in a lattice configuration with a 15.0 mm pitch.

The obtained polishing pad (pad 1) was then installed in a CMP polishing device (PPO-60S from Nomura Machine Tool Works Ltd.) and the surface of the polishing pad was ground, using an MEC100-L diamond dresser from Mitsubishi Materials Corporation, for 18 minutes at 0.18 MPa and a dresser rotation rate of 110 rpm (also referred to hereafter as "seasoning").

A silicon wafer (diameter=8 inches) having an oxide film surface was then polished for 100 seconds under the following conditions: platen rotation rate=50 rpm, head rotation rate=49 rpm, polishing pressure=45 kPa, polishing time=100 seconds. This polishing was carried out while feeding a fluid prepared by the two-fold dilution of SS25 polishing slurry (Cabot Corporation) with distilled water; the feed rate was 120 mL/minute. The scratch count on the surface of the silicon wafer after polishing, the polishing rate (initial polishing rate), and the nonuniformity are shown in Table 3. In addition, the polishing pad was held wet for 24 hours at 25° C. and then reseasoned; the polishing rate (polishing rate after holding for 24 hours) is shown in Table 3 when a silicon wafer (diameter=8 inches) having an oxide film surface was polished for 100 seconds.

Example 5

Thermoplastic polyurethane (PU-2) was charged to a singe-screw extrusion molder (90 mmφ) and was extruded from a T-die at a cylinder temperature of 215 to 225° C. and a die temperature of 225° C. and was then passed through rolls that had a 1.8 mm gap and were thermostatted to 60° C. to mold a sheet having a thickness of 2 mm. The obtained sheet (60 cm×60 cm) was introduced into a pressure-resistant container and carbon dioxide was dissolved therein for 10 hours at a temperature of 110° C. and a pressure of 9 NPa to yield a dissolved gas-containing sheet that contained 5.1 weight % carbon dioxide. After cooling to room temperature, the pressure was returned to ambient pressure and the dissolved gas-containing sheet was took out from the pressure-resistant container. The resulting dissolved gas-containing sheet was then immersed for 3 minutes in 155° C. silicone oil and took out and cooled to room temperature to yield a foam. The resulting foam had a density of 1.00 g/cm³ and an average cell size of 48 μm. The surface of the resulting foam (sheet) was ground to give a uniform sheet having a thickness of 1.5 mm and having cells exposed on the surface; a circular polishing pad (pad 2) having a diameter of 51 cm was then fabricated by forming grooves (width=2.2 mm, depth=1.2 mm) in a lattice configuration with a 15.0 mm pitch.

The obtained polishing pad (pad 2) was then installed in a CMP polishing device (PPO-60S from Nomura Machine Tool Works Ltd.) and the surface of the polishing pad was ground, using an MEC100-L diamond dresser from Mitsubishi Materials Corporation, for 18 minutes at 0.18 MPa and a dresser rotation rate of 110 rpm.

A silicon wafer (diameter=8 inches) having an oxide film surface was then polished for 100 seconds under the following conditions: platen rotation rate=50 rpm, head rotation rate=49 rpm, polishing pressure=35 kPa, polishing time=100 seconds. This polishing was carried out while feeding a fluid prepared by the two-fold dilution of SS25 polishing slurry (Cabot Corporation) with distilled water; the feed rate was 120 mL/minute. The scratch count on the surface of the silicon wafer after polishing and the polishing rate (initial polishing rate) are shown in Table 3. In addition, the polishing pad was held wet for 24 hours at 25° C. and then reseasoned; the polishing rate (polishing rate after holding for 24 hours) is shown in Table 3 when a silicon wafer (diameter=8 inches) having an oxide film surface was polished for 100 seconds.

Example 6

Thermoplastic polyurethane (PU-3) was charged to a singe-screw extrusion molder (90 mmφ) and was extruded from a T-die at a cylinder temperature of 215 to 225° C. and a die temperature of 225° C. and was then passed through rolls that had a 1.8 mm gap and were thermostatted to 60° C. to mold a sheet having a thickness of 2 mm. The obtained sheet (60 cm×60 cm) was introduced into a pressure-resistant container and carbon dioxide was dissolved therein for 10 hours at a temperature of 110° C. and a pressure of 8 MPa to yield a dissolved gas-containing sheet that contained 3.6 weight % carbon dioxide. After cooling to room temperature, the pressure was returned to ambient pressure and the dissolved gas-containing sheet was took out from the pressure-resistant container. The resulting dissolved gas-containing sheet was then immersed for 3 minutes in 120° C. silicone oil and took out and cooled to room temperature to yield a foam. The resulting foam had a density of 0.85 g/cm$^3$ and an average cell size of 18 μm. The surface of the resulting foam (sheet) was ground to give a uniform sheet having a thickness of 1.5 mm and having cells exposed on the surface; a circular polishing pad (pad 3) having a diameter of 51 cm was then fabricated by forming grooves (width=2.2 mm, depth=1.2 mm) in a lattice configuration with a 15.0 mm pitch.

The obtained polishing pad (pad 3) was then installed in a CMP polishing device (PPO-60S from Nomura Machine Tool Works Ltd.) and the surface of the polishing pad was ground, using an MEC100-L diamond dresser from Mitsubishi Materials Corporation, for 18 minutes at 0.18 MPa and a dresser rotation rate of 110 rpm.

A silicon wafer (diameter=8 inches) having an oxide film surface was then polished for 100 seconds under the following conditions: platen rotation rate=50 rpm, head rotation rate=49 rpm, polishing pressure=35 kPa, polishing time=100 seconds. This polishing was carried out while feeding a fluid prepared by the two-fold dilution of SS25 polishing slurry (Cabot Corporation) with distilled water, the feed rate was 120 mL/minute. The scratch count on the surface of the silicon wafer after polishing, the polishing rate (initial polishing rate), and the nonuniformity are shown in Table 3. In addition, the polishing pad was held wet for 24 hours at 25° C. and then reseasoned, the polishing rate (polishing rate after holding for 24 hours) is shown in Table 3 when a silicon wafer (diameter=8 inches) having an oxide film surface was polished for 100 seconds.

Example 7

Thermoplastic polyurethane (PU-3) was charged to a singe-screw extrusion molder (90 mmφ) and was extruded from a T-die at a cylinder temperature of 215 to 225° C. and a die temperature of 225° C. and was then passed through rolls that had a 1.8 mm gap and were thermostatted to 60° C. to mold a sheet having a thickness of 2 mm. The obtained sheet (60 cm×60 cm) was introduced into a pressure-resistant container and carbon dioxide was dissolved therein for 10 hours at a temperature of 110° C. and a pressure of 8 MPa to yield a dissolved gas-containing sheet that contained 3.6 weight % carbon dioxide. After cooling to room temperature, the pressure was returned to ambient pressure and the dissolved gas-containing sheet was took out from the pressure-resistant container. The resulting dissolved gas-containing sheet was then immersed for 3 minutes in 145° C. silicone oil and took out and cooled to room temperature to yield a foam. The resulting foam had a density of 0.45 g/cm$^3$ and an average cell size of 18 μm. The surface of the resulting foam (sheet) was ground to give a uniform sheet having a thickness of 1.5 mm and having cells exposed on the surface; a circular polishing pad (pad 4) having a diameter of 51 cm was then fabricated by forming grooves (width=2.2 mm, depth=1.2 mm) in a lattice configuration with a 15.0 mm pitch.

The obtained polishing pad (pad 4) was then installed in a CMP polishing device (PPO-60S from Nomura Machine Tool Works Ltd.) and the surface of the polishing pad was ground, using an MEC100-L diamond dresser from Mitsubishi Materials Corporation, for 18 minutes at 0.18 MPa and a dresser rotation rate of 110 rpm.

A silicon wafer (diameter=8 inches) having an oxide film surface was then polished for 100 seconds under the following conditions: platen rotation rate=50 rpm, head rotation rate=49 rpm, polishing pressure=35 kPa, polishing time=100 seconds. This polishing was carried out while feeding a fluid prepared by the two-fold dilution of SS25 polishing slurry (Cabot Corporation) with distilled water, the feed rate was 120 mL/minute. The scratch count on the surface of the silicon wafer after polishing and the polishing rate (initial polishing rate) are shown in Table 3. In addition, the polishing pad was held wet for 24 hours at 25° C. and then reseasoned; the polishing rate (polishing rate after holding for 24 hours) is shown in Table 3 when a silicon wafer (diameter=8 inches) having an oxide film surface was polished for 100 seconds.

Comparative Example 4

Thermoplastic polyurethane (PU-4) was charged to a singe-screw extrusion molder (90 mmφ) and was extruded from a T-die at a cylinder temperature of 215 to 225° C. and a die temperature of 225° C. and was then passed through rolls that had a 1.8 mm gap and were thermostatted to 60° C. to mold a sheet having a thickness of 2 mm. The obtained sheet (60 cm×60 cm) was introduced into a pressure-resistant container and carbon dioxide was dissolved therein for 10 hours at a temperature of 130° C. and a pressure of 7 MPa to yield a dissolved gas-containing sheet that contained 2.5 weight % carbon dioxide. After cooling to room temperature, the pressure was returned to ambient pressure and the dissolved gas-containing sheet was took out from the pressure-resistant container. The resulting dissolved gas-containing sheet was then immersed for 3 minutes in 115° C. silicone oil and took out and cooled to room temperature to yield a foam. The resulting foam had a density of 0.84 g/cm³ and an average cell size of 17 μm. The surface of the resulting foam (sheet) was ground to give a uniform sheet having a thickness of 1.5 mm and having cells exposed on the surface; a circular polishing pad (pad 5) having a diameter of 51 cm was then fabricated by forming grooves (width=2.2 mm, depth=1.2 mm) in a lattice configuration with a 15.0 mm pitch.

The obtained polishing pad (pad 5) was then installed in a CMP polishing device (PPO-60S from Nomura Machine Tool Works Ltd.) and the surface of the polishing pad was ground, using an MEC100-L diamond dresser from Mitsubishi Materials Corporation, for 18 minutes at 0.18 MPa and a dresser rotation rate of 110 rpm.

A silicon wafer (diameter=8 inches) having an oxide film surface was then polished for 100 seconds under the following conditions: platen rotation rate=50 rpm, head rotation rate=49 rpm, polishing pressure=35 kPa, polishing time=100 seconds. This polishing was carried out while feeding a fluid prepared by the two-fold dilution of SS25 polishing slurry (Cabot Corporation) with distilled water; the feed rate was 120 mL/minute. The scratch count on the surface of the silicon wafer after polishing and the polishing rate (initial polishing rate) are shown in Table 4. In addition, the polishing pad was held wet for 24 hours at 25° C. and then reseasoned; the polishing rate (polishing rate after holding for 24 hours) is shown in Table 4 when a silicon wafer (diameter=8 inches) having an oxide film surface was polished for 100 seconds.

Comparative Example 5

Thermoplastic polyurethane (PU-5) was charged to a singe-screw extrusion molder (90 mmφ) and was extruded from a T-die at a cylinder temperature of 215 to 225° C. and a die temperature of 225° C. and was then passed through rolls that had a 18 mm gap and were thermostatted to 60° C. to mold a sheet having a thickness of 2 mm. The obtained sheet (60 cm×60 cm) was introduced into a pressure-resistant container and carbon dioxide was dissolved therein for 10 hours at a temperature of 130° C. and a pressure of 9 MPa to yield a dissolved gas-containing sheet that contained 3.4 weight % carbon dioxide. After cooling to room temperature, the pressure was returned to ambient pressure and the dissolved gas-containing sheet was took out from the pressure-resistant container. The resulting dissolved gas-containing sheet was then immersed for 3 minutes in 110° C. silicone oil and took out and cooled to room temperature to yield a foam. The resulting foam had a density of 0.85 g/cm³ and an average cell size of 63 μm. The surface of the resulting foam (sheet) was ground to give a uniform sheet having a thickness of 1.5 mm and having cells exposed on the surface; a circular polishing pad (pad 6) having a diameter of 51 cm was then fabricated by forming grooves (width=2.2 mm, depth=1.2 mm) in a lattice configuration with a 15.0 mm pitch.

The obtained polishing pad (pad 6) was then installed in a CMP polishing device (PPO-60S from Nomura Machine Tool Works Ltd.) and the surface of the polishing pad was ground, using an MEC100-L diamond dresser from Mitsubishi Materials Corporation, for 18 minutes at 0.18 MPa and a dresser rotation rate of 110 rpm.

A silicon wafer (diameter=8 inches) having an oxide film surface was then polished for 100 seconds under the following conditions: platen rotation rate=50 rpm, head rotation rate=49 rpm, polishing pressure=35 kPa, polishing time=100 seconds. This polishing was carried out while feeding a fluid prepared by the two-fold dilution of SS25 polishing slurry (Cabot Corporation) with distilled water; the feed rate was 120 mL/minute. The scratch count on the surface of the silicon wafer after polishing and the polishing rate (initial polishing rate) are shown in Table 4. In addition, the polishing pad was held wet for 24 hours at 25° C. and then reseasoned; the polishing rate (polishing rate after holding for 24 hours) is shown in Table 4 when a silicon wafer (diameter=8 inches) having an oxide film surface was polished for 100 seconds.

Comparative Example 6

Thermoplastic polyurethane (PU-6) was charged to a singe-screw extrusion molder (90 mmφ) and was extruded from a T-die at a cylinder temperature of 215 to 225° C. and a die temperature of 225° C. and was then passed through rolls that had a 1.8 mm gap and were thermostatted to 60° C. to mold a sheet having a thickness of 2 mm. The obtained sheet (60 cm×60 cm) was introduced into a pressure-resistant container and carbon dioxide was dissolved therein for 6 hours at a temperature of 100° C. and a pressure of 8 MPa to yield a dissolved gas-containing sheet that contained 4.5 weight % carbon dioxide. After cooling to room temperature, the pressure was returned to ambient pressure and the dissolved gas-containing sheet was took out from the pressure-resistant container. The resulting dissolved gas-containing sheet was then immersed for 3 minutes in 90° C. silicone oil and took out and cooled to room temperature to yield a foam. The resulting foam had a density of 0.81 g/cm³ and an average cell size of 16 μm. The surface of the resulting foam (sheet) was ground to give a uniform sheet having a thickness of 1.5 mm and having cells exposed on the surface; a circular polishing pad (pad 7) having a diameter of 51 cm was then fabricated by forming grooves (width=2.2 mm, depth=1.2 mm) in a lattice configuration with a 15.0 mm pitch.

The obtained polishing pad (pad 7) was then installed in a CMP polishing device (PPO-60S from Nomura Machine Tool Works Ltd.) and the surface of the polishing pad was ground, using an MEC100-L diamond dresser from Mitsubishi Materials Corporation, for 18 minutes at 0.18 MPa and a dresser rotation rate of 110 rpm.

A silicon wafer (diameter=8 inches) having an oxide film surface was then polished for 100 seconds under the following conditions: platen rotation rate=50 rpm, head rotation rate=49 rpm, polishing pressure=35 kPa, polishing time=100 seconds. This polishing was carried out while feeding a fluid prepared by the two-fold dilution of SS25 polishing slurry (Cabot Corporation) with distilled water; the feed rate was 120 mL/minute. The scratch count on the surface of the silicon wafer after polishing and the polishing rate (initial polishing rate) are shown in Table 4. In addition, the polishing pad was held wet for 24 hours at 25° C. and then reseasoned; the polishing rate (polishing rate after holding for 24 hours) is shown in Table 4 when a silicon wafer (diameter=8 inches) having an oxide film surface was polished for 100 seconds.

TABLE 1

|  | Example 1 | Example 2 | Example 3 |
| --- | --- | --- | --- |
| polymer material designation | PU-1 | PU-2 | PU-3 |
| resin composition |  |  |  |
| polymer polyol | PTMG2000/ PNOA2000 | PNOA2000/ PEG600 | PTMG1400 |
| chain extender | CHDM/BD | CHDM/BD | CHDM |
| organic diisocyanate | MDI | MDI | MDI |
| content of nitrogen atom derived from the isocyanate group (weight %) | 5.7 | 5.4 | 5.9 |
| tensile modulus at 50° C. |  |  |  |
| after saturation swelling with 50° C. water (A) (MPa) | 686 | 287 | 565 |
| after being allowed to stand at 20° C./65% RH (B) (MPa) | 891 | 463 | 689 |
| retention of tensile modulus (%) ((A/B) × 100) | 77 | 62 | 82 |
| $E'_{23}/E'_{50}$ | 1.2 | 1.7 | 1.1 |
| loss tangent at 50° C. | 0.035 | 0.122 | 0.040 |
| contact angle with water (°) | 71 | 74 | 74 |

TABLE 2

|  | Comparative Example 1 | Comparative Example 2 | Comparative Example 3 |
| --- | --- | --- | --- |
| polymer material designation | PU-4 | PU-5 | PU-6 |
| resin composition |  |  |  |
| polymer polyol | PMPA500 | DD550 | PTMG1000 |
| chain extender | CHDM | CHDM | CHDM |
| organic diisocyanate | MDI | MDI | MDI |
| content of nitrogen atom derived from the isocyanate group (weight %) | 6.8 | 5.8 | 5.3 |
| tensile modulus at 50° C. |  |  |  |
| after saturation swelling with 50° C. water (A) (MPa) | 1265 | 1315 | 110 |
| after being allowed to stand at 20° C./65% RH (B) (MPa) | 1406 | 1342 | 733 |
| retention of tensile modulus (%) ((A/B) × 100) | 90 | 98 | 15 |
| $E'_{23}/E'_{50}$ | 1.1 | 1.1 | 2.0 |
| loss tangent at 50° C. | 0.047 | 0.048 | 0.112 |
| contact angle with water (°) | 77 | 81 | 70 |

TABLE 3

|  | Example 4 | Example 5 | Example 6 | Example 7 |
| --- | --- | --- | --- | --- |
| polishing pad designation | pad 1 | pad 2 | pad 3 | pad 4 |
| resin used | PU-1 | PU-2 | PU-3 | PU-4 |
| thickness (mm) | 1.5 | 1.5 | 1.5 | 1.5 |
| JIS-D hardness of the polishing pad | 65 | 60 | 66 | 46 |
| cell count (number/mm$^2$) | 0 | 200 | 2149 | 3313 |
| density (g/cm$^3$) | 1.20 | 1.00 | 0.85 | 0.45 |
| polishing performance |  |  |  |  |
| polishing pressure during the test (kPa) | 45 | 35 | 35 | 35 |
| scratch count (number) | 10 | 95 | 126 | 58 |
| initial polishing rate (C) (Å/minute) | 3191 | 2017 | 2477 | 2117 |
| nonuniformity (%)*[1] | 6 | — | 8 | — |
| polishing rate after holding for 24 hours (D) (Å/minute) | 3031 | 1977 | 2328 | 2074 |
| (D/C) × 100 (%) | 95 | 98 | 94 | 98 |

*[1] [—] = not measured

TABLE 4

|  | Comparative Example 4 | Comparative Example 5 | Comparative Example 6 |
| --- | --- | --- | --- |
| polishing pad designation | pad 5 | pad 6 | pad 7 |
| resin used | PU-4 | PU-5 | PU-6 |
| thickness (mm) | 1.5 | 1.5 | 1.5 |
| JIS-D hardness of the polishing pad | 68 | 72 | 60 |
| cell count (number/mm$^2$) | 2532 | 2218 | 2876 |
| density (g/cm$^3$) | 0.84 | 0.85 | 0.81 |
| polishing performance |  |  |  |
| polishing pressure during the test (kPa) | 35 | 35 | 35 |
| scratch count (number) | 60372 | 68482 | 13071 |
| initial polishing rate (C) (Å/minute) | 2281 | 2352 | 2276 |
| nonuniformity (%)*[1] | — | — | — |

TABLE 4-continued

| | Comparative Example 4 | Comparative Example 5 | Comparative Example 6 |
|---|---|---|---|
| polishing rate after holding for 24 hours (D) (Å/minute) | 2235 | 2258 | 1024 |
| (D/C) × 100 (%) | 98 | 96 | 45 |

*[1)[—] = not measured

It is clear from Table 3 that, in Examples 4 to 7, little scratching is produced during wafer polishing and the polishing rate is also stable. In contrast to this, Table 4 shows that, in Comparative Examples 4 to 6, substantial scratching is produced during wafer polishing or that the polishing rate is not stable.

Example 8

A layered polishing pad (pad 8) was fabricated by bonding elastic layer-1 to the back surface (side in which the grooves were not formed) of a polishing pad (pad 1, JIS-D hardness=65) fabricated as in Example 4; bonding was carried out using a two-sided pressure-sensitive adhesive sheet.

The obtained layered polishing pad (pad 8) was installed in a CMP polishing device (PPO-60S from Nomura Machine Tool Works Ltd.) and the surface of the polishing pad was ground, using an MEC100-L diamond dresser from Mitsubishi Materials Corporation, for 18 minutes at 0.18 MPa and a dresser rotation rate of 110 rpm.

A silicon wafer (diameter=8 inches) having an oxide film surface was then polished for 100 seconds under the following conditions: platen rotation rate=50 rpm, head rotation rate=49 rpm, polishing pressure=45 kPa, polishing time=100 seconds. This polishing was carried out while feeding a fluid prepared by the two-fold dilution of SS25 polishing slurry (Cabot Corporation) with distilled water, the feed rate was 120 mL/minute. The polishing rate (initial polishing rate) and the nonuniformity are shown in Table 5.

Example 9

A layered polishing pad (pad 9) was fabricated by bonding elastic layer-1 to the back surface (side in which the grooves were not formed) of a polishing pad (pad 3, JIS-D hardness=66) fabricated as in Example 6; bonding was carried out using a two-sided pressure-sensitive adhesive sheet.

The obtained layered polishing pad (pad 9) was installed in a CMP polishing device (PPO-60S from Nomura Machine Tool Works Ltd.) and the surface of the polishing pad was ground, using an MEC100-L diamond dresser from Mitsubishi Materials Corporation, for 18 minutes at 0.18 MPa and a dresser rotation rate of 110 rpm.

A silicon wafer (diameter=8 inches) having an oxide film surface was then polished for 100 seconds under the following conditions: platen rotation rate=50 rpm, head rotation rate=49 rpm, polishing pressure=35 kPa, polishing time=100 seconds. This polishing was carried out while feeding a fluid prepared by the two-fold dilution of SS25 polishing slurry (Cabot Corporation) with distilled water; the feed rate was 120 mL/minute. The polishing rate (initial polishing rate) and the nonuniformity are shown in Table 5.

Example 10

A layered polishing pad (pad 10) was fabricated by bonding elastic layer-2 to the back surface (side in which the grooves were not formed) of a polishing pad (pad 3, JIS-D hardness=66) fabricated as in Example 6; bonding was carried out using a two-sided pressure-sensitive adhesive sheet.

The obtained layered polishing pad (pad 10) was installed in a CMP polishing device (PPO-60S from Nomura Machine Tool Works Ltd.) and the surface of the polishing pad was ground, using an MEC100-L diamond dresser from Mitsubishi Materials Corporation, for 18 minutes at 0.18 MPa and a dresser rotation rate of 110 rpm.

A silicon wafer (diameter=8 inches) having an oxide film surface was then polished for 100 seconds under the following conditions: platen rotation rate=50 rpm, head rotation rate=49 rpm, polishing pressure=35 kPa, polishing time=100 seconds. This polishing was carried out while feeding a fluid prepared by the two-fold dilution of SS25 polishing slurry (Cabot Corporation) with distilled water; the feed rate was 120 mL/minute. The polishing rate (initial polishing rate) and the nonuniformity are shown in Table 5.

Example 11

A layered polishing pad (pad 11) was fabricated by bonding elastic layer-3 using a two-sided pressure-sensitive adhesive sheet to the back surface (side in which the grooves were not formed) of a polishing pad (JIS-D hardness=66) fabricated as in Example 6 with the following exceptions: the thickness was changed from 1.5 mm to 0.8 mm by adjusting the grinding of the surface of the foam (sheet); the groove depth was changed from 1.2 mm to 0.5 mm.

The obtained layered polishing pad (pad 11) was installed in a CMP polishing device (PPO-60S from Nomura Machine Tool Works Ltd.) and the surface of the polishing pad was ground, using an MEC100-L diamond dresser from Mitsubishi Materials Corporation, for 18 minutes at 0.18 MPa and a dresser rotation rate of 110 rpm.

A silicon wafer (diameter=8 inches) having an oxide film surface was then polished for 100 seconds under the following conditions: platen rotation rate=50 rpm, head rotation rate=49 rpm, polishing pressure=35 kPa, polishing time=100 seconds. This polishing was carried out while feeding a fluid prepared by the two-fold dilution of SS25 polishing slurry (Cabot Corporation) with distilled water; the feed rate was 120 mL/minute. The polishing rate (initial polishing rate) and the nonuniformity are shown in Table 5.

Example 12

A layered polishing pad (pad 12) was fabricated by bonding elastic layer-4 using a two-sided pressure-sensitive adhesive sheet to the back surface (side in which the grooves were not formed) of a polishing pad (JIS-D hardness=66) fabricated as in Example 6 with the following exceptions: the thickness was changed from 1.5 mm to 0.8 mm by adjusting the grinding of the surface of the foam (sheet); the groove depth was changed from 1.2 mm to 0.5 mm.

The obtained layered polishing pad (pad 12) was installed in a CMP polishing device (PPO-60S from Nomura Machine Tool Works Ltd.) and the surface of the polishing pad was ground, using an MEC100-L diamond dresser from Mitsubishi Materials Corporation, for 18 minutes at 0.18 MPa and a dresser rotation rate of 110 rpm.

A silicon wafer (diameter=8 inches) having an oxide film surface was then polished for 100 seconds under the following conditions: platen rotation rate=50 rpm, head rotation rate=49 rpm, polishing pressure=35 kPa, polishing time=100 seconds. This polishing was carried out while feeding a fluid prepared by the two-fold dilution of SS25 polishing slurry (Cabot Corporation) with distilled water; the feed rate was 120 mL/minute. The polishing rate (initial polishing rate) and the nonuniformity are shown in Table 5.

TABLE 5

|  | Example 8 | Example 9 | Example 10 | Example 11 | Example 12 |
|---|---|---|---|---|---|
| polishing pad designation | pad 8 | pad 9 | pad 10 | pad 11 | pad 12 |
| polishing layer |  |  |  |  |  |
| resin used | PU-1 | PU-3 | PU-3 | PU-3 | PU-3 |
| thickness (mm) | 1.5 | 1.5 | 1.5 | 0.8 | 0.8 |
| JIS-D hardness | 65 | 66 | 66 | 66 | 66 |
| density (g/cm³) | 1.20 | 0.85 | 0.85 | 0.85 | 0.85 |
| elastic layer |  |  |  |  |  |
| thickness (mm) | 2 | 2 | 2.5 | 2 | 2 |
| JIS-C hardness | 65 | 65 | 30 | 30 | 70 |
| void ratio (volume %) | 48 | 48 | 86 | 86 | 48 |
| polishing performance |  |  |  |  |  |
| polishing pressure during the test (kPa) | 45 | 35 | 35 | 35 | 35 |
| initial polishing rate (Å/minute) | 3185 | 2487 | 2425 | 2455 | 2475 |
| nonuniformity (%) | 1 | 3 | 3 | 4 | 4 |

As is clear from Table 5, it may be understood that an additional improvement in polishing uniformity is obtained by the use of a layered polishing pad.

INDUSTRIAL APPLICABILITY

The polymer material and the foam obtained therefrom according to the present invention can be applied, for example, to polishing pads and so forth.

The invention claimed is:

1. A polishing pad, consisting of:
a polymer material having a tensile modulus of 130 to 800 MPa at 50° C. after saturation swelling with 50° C. water, a loss tangent at 50° C. of not more than 0.2, and a contact angle with water of not more than 80°,
wherein the polymer material is a thermoplastic polyurethane obtained by reacting a polymer diol, an organic diisocyanate, and a chain extender,
wherein the thermoplastic polyurethane comprises at least 4.9 weight % but less than 6.0 weight % nitrogen atom derived from the isocyanate group, and
wherein the polymer material has substantially no foam structure.

2. The polishing pad of claim 1, wherein the polymer material has a retention of tensile modulus of at least 55%,
wherein the retention of tensile modulus is a value obtained by dividing the tensile modulus at 50° C. after saturation swelling with 50° C. water by a tensile modulus at 50° C. after being allowed to stand at 20° C./65% RH, and then multiplying by 100.

3. The polishing pad of claim 1, wherein a ratio, $E'_{23}/E'_{50}$, of a storage modulus at 23° C. ($E'_{23}$) to a storage modulus at 50° C. ($E'50$) of the polymer material is not more than 1.8.

4. The polishing pad of claim 1, wherein the polymer material consist essentially of the thermoplastic polyurethane having substantially no foam structure.

5. The polishing pad of claim 1, wherein the polymer diol comprises a component having a number-average molecular weight of 1400 to 5000.

6. The polishing pad of claim 1, wherein the polymer diol comprises at least one selected from the group consisting of a polyester diol and a polyether diol.

7. The polishing pad of claim 1, wherein the polymer diol comprises a polyester diol comprising, in reacted form, a $C_{6-12}$ diol.

8. The polishing pad of claim 1, wherein the polymer material is obtained by reacting:
at least one selected from the group consisting of poly (ethylene glycol), poly(tetramethylene glycol), poly (nonamethylene adipate), poly(2-methyl-1,8-octamethylene adipate), poly(2-methyl-1,8-octamethylene-co-nonamethylene adipate), and poly(methylpentane adipate) as the polymer diol;
at least one selected from the group consisting of 4,4'-diphenylmethane diisocyanate, 2,4-tolylene diisocyanate, 2,6-tolylene diisocyanate, and isophorone diisocyanate as the organic diisocyanate; and
at least one selected from the group consisting of 1,3-propanediol, 1,4-butanediol, neopentyl glycol, 1,5-pentanediol, 1,6-hexanediol, and cyclohexanedimethanol as the chain extender.

9. The polishing pad of claim 1, wherein the polymer diol comprises a component having a number-average molecular weight of 2000 to 4000.

10. The polishing pad of claim 1, wherein the polymer diol has a number-average molecular weight of 2000 to 4000.

11. A method of polishing a silicon wafer or semiconductor wafer, the method comprising
contacting the polishing pad of claim 1 with a surface of the silicon wafer or semiconductor wafer,
wherein the contacting is carried out by applying pressure at a prescribed velocity and for a prescribed period of time.

12. A method of producing a semiconductor device, the method comprising:
polishing a semiconductor wafer with the polishing pad of claim 1.

13. A polishing pad, comprising:
(I) a polishing layer consisting of a polymer material having a tensile modulus of 130 to 800 MPa at 50° C. after saturation swelling with 50° C. water, a loss tangent at 50° C. of not more than 0.2, and a contact angle with water of not more than 80°; and
(II) an elastic layer having a hardness lower than that of the polishing layer,
wherein the polymer material is a thermoplastic polyurethane obtained by reacting a polymer diol, an organic diisocyanate, and a chain extender,
wherein the thermoplastic polyurethane comprises at least 4.9 weight % but less than 6.0 weight % nitrogen atom derived from the isocyanate group, and
wherein the polymer material has substantially no foam structure.

14. The polishing pad of claim 13, wherein:
the polishing layer has a JIS-D hardness of at least 55; and
the elastic layer has a JIS-C hardness of 20 to 80.

15. The polishing pad of claim 13, wherein:
the thickness of the polishing layer is 0.3 to 2 mm; and
the thickness of the elastic layer is 0.5 to 3 mm.

16. The polishing pad of claim 13, wherein the elastic layer comprises a polyurethane.

17. The polishing pad of claim 13, wherein the polymer diol comprises a component having a number-average molecular weight of 2000 to 4000.

18. The polishing pad of claim 13, wherein the polymer diol has a number-average molecular weight of 2000 to 4000.

19. The polishing pad of claim 13, wherein:
the polishing layer has a JIS-D hardness of 60 to 80; and
the elastic layer has a JIS-C hardness of 30 to 70.

20. The polishing pad of claim 13, wherein:
the thickness of the polishing layer is 0.5 to 1.8 mm; and
the thickness of the elastic layer is 1.0 to 2.5 mm.

* * * * *